(12) United States Patent
Deng

(10) Patent No.: US 10,483,371 B2
(45) Date of Patent: Nov. 19, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Hao Deng, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/925,974

(22) Filed: Mar. 20, 2018

(65) Prior Publication Data
US 2018/0277653 A1    Sep. 27, 2018

(30) Foreign Application Priority Data

Mar. 21, 2017    (CN) .......................... 2017 1 0169123

(51) Int. Cl.
| H01L 29/66 | (2006.01) |
| H01L 21/762 | (2006.01) |
| H01L 29/423 | (2006.01) |
| H01L 21/768 | (2006.01) |
| H01L 21/02 | (2006.01) |
| H01L 21/28 | (2006.01) |
| H01L 29/49 | (2006.01) |
| H01L 29/51 | (2006.01) |

(52) U.S. Cl.
CPC .. *H01L 29/66545* (2013.01); *H01L 21/02271* (2013.01); *H01L 21/28088* (2013.01); *H01L 21/762* (2013.01); *H01L 21/76829* (2013.01); *H01L 21/76843* (2013.01); *H01L 29/4232* (2013.01); *H01L 29/4966* (2013.01); *H01L 29/513* (2013.01); *H01L 29/517* (2013.01)

(58) Field of Classification Search
CPC .................................................. H01L 21/02271
See application file for complete search history.

(56) References Cited

U.S. PATENT DOCUMENTS

| 2005/0212119 A1* | 9/2005 | Shero ..................... C23C 16/308 257/705 |
| 2006/0186484 A1* | 8/2006 | Chau ................. H01L 29/66628 257/401 |
| 2010/0110753 A1* | 5/2010 | Slesazeck .............. G11C 5/063 365/145 |

(Continued)

*Primary Examiner* — Thao P Le
(74) *Attorney, Agent, or Firm* — Anova Law Group, PLLC

(57) ABSTRACT

A semiconductor structure and a fabrication method are provided. The fabrication method includes: providing a substrate; forming a gate dielectric layer on the substrate; forming a dielectric barrier layer structure on the gate dielectric layer, a first silicon source gas being used to dope silicon in the dielectric barrier layer structure; forming a work function layer on the dielectric barrier layer structure; forming a gate barrier layer structure on the work function layer, a second silicon source gas being used to dope silicon in the gate barrier layer structure; and forming a gate electrode layer on the gate barrier layer structure.

18 Claims, 5 Drawing Sheets

(56) References Cited

U.S. PATENT DOCUMENTS

| | | | | |
|---|---|---|---|---|
| 2014/0015064 A1* | 1/2014 | Bu | ........................ | H01L 27/092 257/369 |
| 2015/0214314 A1* | 7/2015 | Oh | ...................... | H01L 29/4236 257/330 |
| 2016/0035856 A1* | 2/2016 | van Bentum | ..... | H01L 21/28158 257/295 |
| 2016/0365347 A1* | 12/2016 | Bao | ..................... | H01L 27/0924 |
| 2018/0151694 A1* | 5/2018 | Wang | ................ | H01L 21/28088 |

\* cited by examiner

SEMICONDUCTOR STRUCTURE AND FABRICATION METHOD THEREOF

CROSS-REFERENCES TO RELATED APPLICATIONS

This application claims the priority of Chinese patent application No. 201710169123.1, filed on Mar. 21, 2017, the entirety of which is incorporated herein by reference.

FIELD OF THE DISCLOSURE

The present disclosure generally relates to the field of semiconductor manufacturing technologies and, more particularly, relates to a semiconductor structure and a fabrication method thereof.

BACKGROUND

As semiconductor technologies continue to develop, the polysilicon gate electrode layer has been replaced with a metal gate electrode layer. Compared with a polysilicon gate electrode layer, the metal gate electrode layer has lower gate resistance, eliminates the polysilicon depletion effect, and has a good compatibility with high-K gate dielectric materials.

To meet the requirements of high-performance devices, a single-layer or multi-layer of work function layer needs to be formed between the metal gate electrode layer and the gate dielectric layer. The work function layer is used to adjust the threshold voltage of an NMOS transistor or a PMOS transistor. A dielectric barrier layer needs to be formed between the gate dielectric layer and the work function layer, and the dielectric barrier layer is used to block the diffusion of the atoms in the gate dielectric layer into the work function layer. Also, a gate barrier layer needs to be formed between the metal gate electrode layer and the work function layer, and the gate barrier layer is used to block the diffusion of the atoms in the metal gate electrode layer into the work function layer.

However, the performance of conventionally-formed dielectric barrier layer and the gate barrier layer still needs to be improved. The disclosed semiconductor structure and fabrication method are directed to solve one or more problems set forth above and other problems in the art.

BRIEF SUMMARY OF THE DISCLOSURE

One aspect of the present disclosure includes a method of fabricating a semiconductor structure. The fabrication method includes: providing a substrate; forming a gate dielectric layer on the substrate; forming a dielectric barrier layer structure on the gate dielectric layer, a first silicon source gas being used to dope silicon in the dielectric barrier layer structure; forming a work function layer on the dielectric barrier layer structure; forming a gate barrier layer structure on the work function layer, a second silicon source gas being used to dope silicon in the gate barrier layer structure; and forming a gate electrode layer on the gate barrier layer structure.

Another aspect of the present disclosure includes a semiconductor structure. The semiconductor structure includes: a substrate; a gate dielectric layer on the substrate; a dielectric barrier layer structure on the gate dielectric layer, the dielectric barrier layer structure being doped with silicon; a work function layer on the dielectric barrier layer structure; a gate barrier layer structure on the work function layer, the gate barrier layer structure being doped with silicon; and a gate electrode layer on the gate barrier layer structure.

Other aspects of the present disclosure can be understood by those skilled in the art in light of the description, the claims, and the drawings of the present disclosure.

DETAILED DESCRIPTION

Reference will now be made in detail to the exemplary embodiments of the disclosure, which are illustrated in the accompanying drawings. Wherever possible, the same reference numbers will be used throughout the drawings to refer to the same or similar parts.

Figure 1:
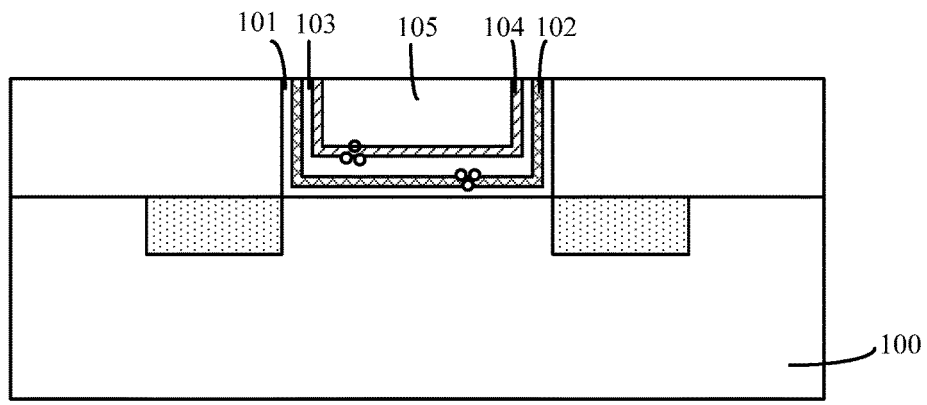
FIG. 1 illustrates schematic structural view of a semiconductor structure corresponding to certain stages of its fabrication process.

FIG. 1 illustrates schematic structural views of a semiconductor structure corresponding to certain stages of its fabrication process.

As shown in FIG. 1, a substrate 100 is provided, and the substrate 100 includes a dielectric layer 101 (not illustrated). A dummy gate opening is formed in the opening of the dielectric layer. A gate dielectric layer 101 is formed on the sidewalls and the bottom of the dummy gate opening. A dielectric barrier layer 102 is formed on the gate dielectric layer 101 and a work function layer 103 is formed on the dielectric barrier layer 102. A gate electrode barrier layer 104 is formed on the work function layer 103, and then a gate electrode layer 105 is formed on the gate barrier layer 104.

As such, the dielectric barrier layer 102 is used to block the diffusion of the ions in the gate dielectric layer 101 into the work function layer 103. The gate barrier layer 104 is used to block the diffusion of the ions in the gate electrode layer 105 into the work function layer 103. However, with continuous increase of the integration degree of a semiconductor device, the size of the gate structure is continuously reduced, and the thicknesses of the dielectric barrier layer 102 and the gate barrier layer 104 are also reduced.

When the thickness of the dielectric barrier layer 102 is continuously reduced, the barrier performance of the dielectric barrier layer 102 against the ions in the gate dielectric layer 101 becomes poorer, such that the ions in the gate dielectric layer 101 can be easily diffused into the work function layer 103, affecting the performance of the work function layer. The dielectric barrier layer 102 is made of titanium nitride, and the lattice structure of a titanium nitride material is a columnar structure. Thus, the barrier performance of the dielectric barrier layer 102 against the ions in the gate dielectric layer 101 becomes even worse, and the ions in the gate dielectric layer 101 can be more easily diffused into the work function layer 103, making the work function value of the work function layer 103 even more unstable. This affects the performance of the work function layer 103 and further affects the performance of the semiconductor structure.

One way to enhance the barrier performance of the dielectric barrier layer 102 against the ions in the gate dielectric layer 101 includes forming a dielectric barrier layer 102 made of silicon-doped titanium nitride. The lattice structure of the silicon-doped titanium nitride material tends to be in an amorphous state, so that the barrier performance of the dielectric barrier layer 102 against the ions in the gate dielectric layer 101 can be very strong, and the ions in the gate dielectric layer 101 cannot easily diffuse into the work function layer 103. As such, the work function value of the work function layer 103 is very stable, and the performance of the work function layer 103 is enhanced.

Accordingly, when the gate barrier layer 104 is made of a material including titanium nitride, the barrier performance of the gate barrier layer 104 against the ions in the gate electrode layer 105 is very poor. One way to improve the barrier performance of the gate barrier layer 104 against the ions in the gate electrode layer 105 includes forming a gate barrier layer 104 made of silicon-doped titanium nitride.

However, both the dielectric barrier layer 102 and the gate barrier layer 104 are made of silicon-doped titanium nitride, which makes the resistance of both the dielectric barrier layer 102 and the gate barrier layer 104 very large and is not good for improving the performance of a semiconductor structure. Further, the process of forming the silicon-doped titanium nitride includes an atomic layer deposition process. The reaction gas of the atomic layer deposition process includes a silicon source gas and the silicon source gas is silane. The silane molecule can generate many free silicon atoms during the atomic layer deposition process, and the free silicon atoms can easily diffuse into the gate electrode layer 105, deteriorating the performance of the gate electrode layer 105 and the performance of the semiconductor structure.

The present disclosure provides a semiconductor structure and the fabrication method thereof. The fabrication method includes: providing a substrate; forming a gate dielectric layer on the substrate; and forming a dielectric barrier layer structure on the gate dielectric layer. In the process of forming the dielectric barrier layer structure, a first silicon source gas is used to dope silicon in the dielectric barrier structure, and the first silicon source gas includes, for example, trisilylamine. The fabrication method further includes forming a work function layer on the dielectric barrier layer; forming a gate barrier layer structure on the work function layer. In the process of forming the gate barrier layer structure, a second silicon source gas is used to dope silicon in the gate barrier layer structure, and the second silicon source gas includes, for example, trisilylamine. A gate electrode layer is formed on the gate barrier layer structure.

In the disclosed fabrication method, the dielectric barrier layer structure is doped with silicon, and the lattice structure of the dielectric barrier layer tends to be in an amorphous state, so that the dielectric barrier layer structure has a strong blocking effect on the ions in the the gate dielectric layer. The ions in the gate dielectric layer cannot easily enter the work function layer, and the work function value of the work function layer is very stable, thereby improving the performance of the work function layer. Accordingly, the gate barrier layer structure is doped with silicon, and the lattice structure of the gate barrier layer structure tends to be in an amorphous state, so that the gate barrier layer structure has a strong blocking effect on the ions in the gate electrode layer. The ions in the gate electrode layer cannot easily enter the work function layer, and the work function value of the work function layer is very stable, thereby improving the performance of the work function layer. The dielectric barrier layer structure is doped with silicon using a first silicon source gas, and the first silicon source gas includes trisilylamine. The trisilylamine molecule has a stable structure, and the silicon ion in the trisilylamine molecule has a large bond energy. Thus, the binding ability of the silicon ions in the dielectric barrier layer structure to the dielectric barrier layer structure is very strong, and the ions in the dielectric barrier layer structure cannot be easily diffused into the gate electrode layer, thereby improving the performance of the gate electrode layer. Correspondingly, silicon is doped in the gate barrier layer structure using a second silicon source gas, and the second silicon source gas includes trisilylamine. The trisilanitril nitrogen molecule is structurally stable, and the silicon ion in the trisilylamine molecule carries a large bond energy, so that the silicon ions in the gate barrier layer structure has a strong binding ability with the gate barrier layer structure. Therefore, the silicon ions in the gate barrier layer structure cannot easily diffuse into the gate electrode layer, thereby improving the performance of the gate electrode layer.

Figure 8:
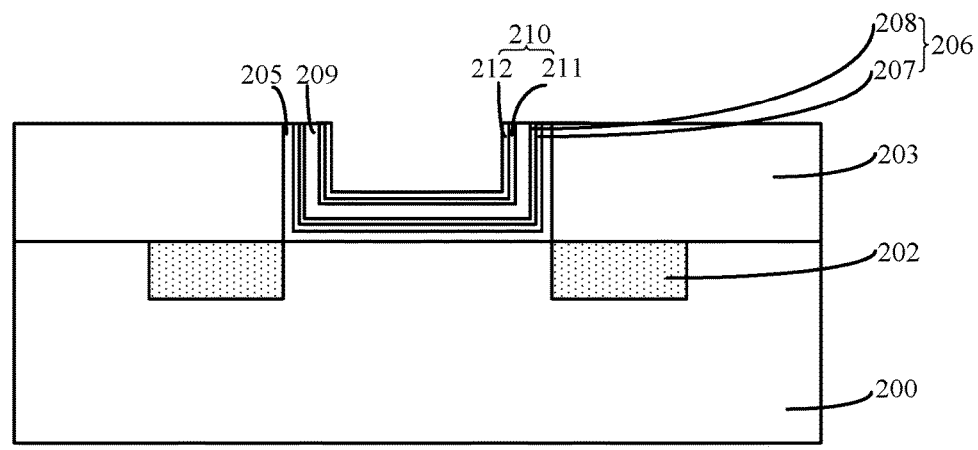
Figure 9:
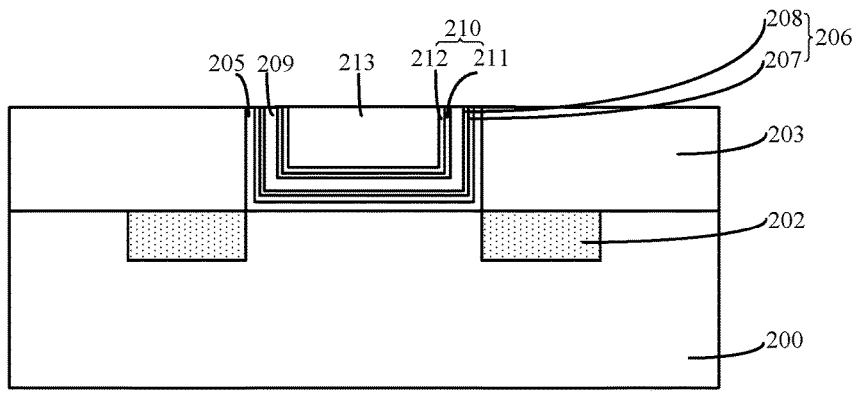
Figure 10:
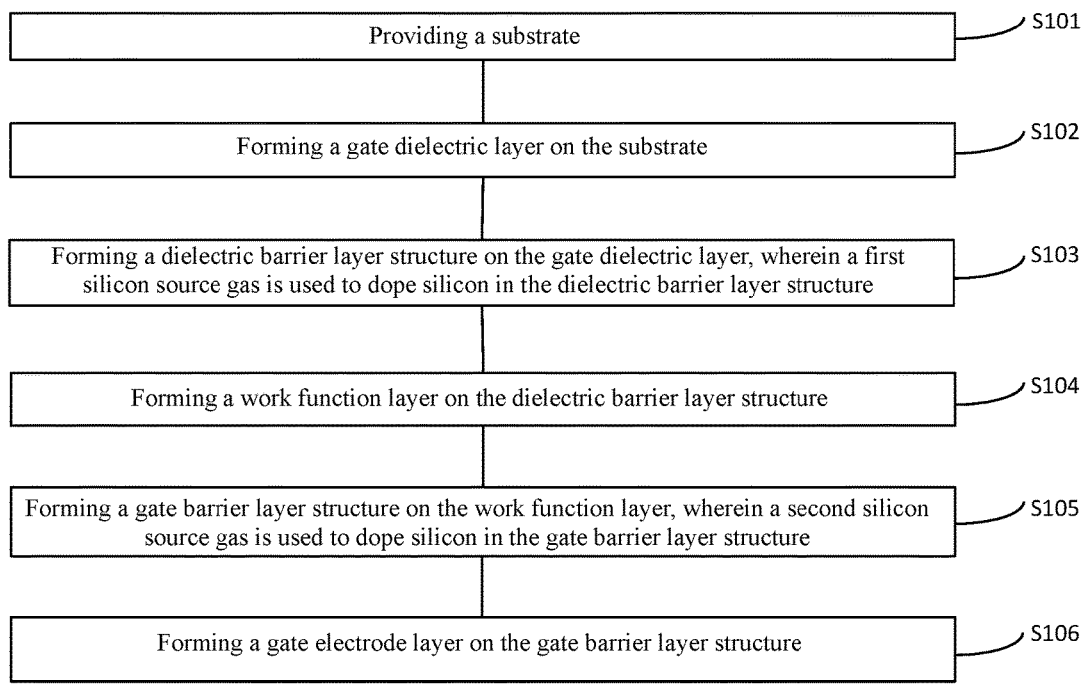
FIG. 10 illustrates an exemplary fabricating process of a semiconductor structure consistent with various disclosed embodiments.

FIG. 10 illustrates an exemplary fabrication process of a semiconductor structure consistent with various disclosed embodiments; and FIGS. 2-9 illustrate schematic structural views of a semiconductor structure corresponding to certain stages of the fabrication process consistent with various disclosed embodiments.

As shown in FIG. 10, at the beginning of the fabrication process, a substrate is provided (S101).

Figure 2:
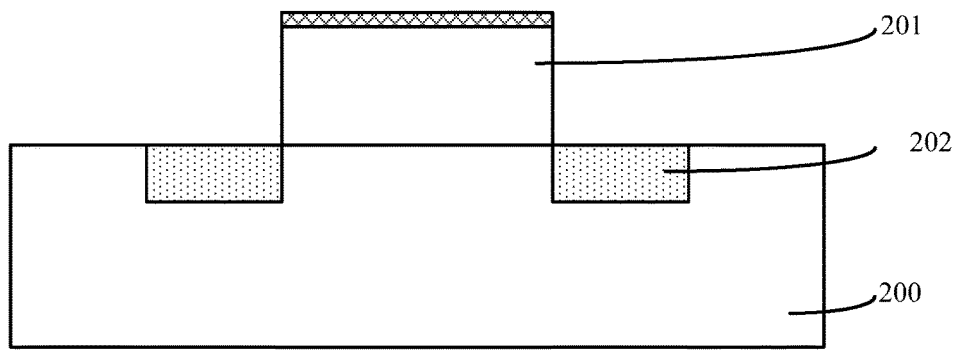
FIGS. 2~9 illustrate schematic structural views of a semiconductor structure corresponding to certain stages of a fabrication process consistent with various disclosed embodiments.

As shown in FIG. 2, a substrate 200 is provided.

In one exemplary embodiment, the substrate 200 is a planar substrate. In other embodiments, the substrate may also include a base substrate and a plurality of fins on the substrate.

In one embodiment, the substrate 200 is a silicon substrate. In other embodiments, the substrate may also be a semiconductor substrate such as a germanium substrate, a silicon germanium substrate, a silicon-on-insulator substrate, a germanium-on-insulator substrate, or a silicon germanium-on-insulator substrate.

In one embodiment, the substrate 200 has a dummy gate structure 201.

In one embodiment, the dummy gate structure 201 is elongated along the extending direction of the substrate 200.

In one embodiment, the dummy gate structure 201 includes a dummy gate electrode on the substrate 200 and a mask layer (not illustrated) on the dummy gate electrode.

In one embodiment, a source/drain doped region 202 is formed on both sides of the dummy gate structure 201.

Returning to FIG. 10, after providing the substrate, the fabrication method further includes forming a gate dielectric layer on the substrate (S102).

Figure 3:
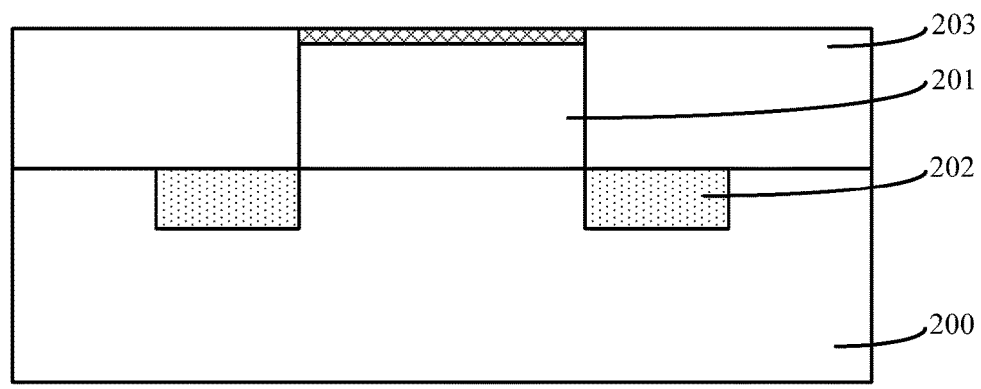

As shown in FIG. 3, a dielectric layer 203 is formed on the substrate 200 and the source/drain doped region 202. The top surface of the dielectric layer 203 is level with the top surface of the dummy gate structure 201.

The dielectric layer 203 is used to electrically insulate different semiconductor devices.

In one embodiment, the dielectric layer 203 is made of silicon oxide. In other embodiments, the dielectric layer may also be made of silicon nitride.

The formation process of the dielectric layer 203 includes: forming a dielectric film on the substrate 200, the dummy gate structure 201 and the source/drain doped region 202;

and planarizing the dielectric film until the top surface of the dummy gate structure 201 is exposed, forming the dielectric layer 203.

The formation process of the dielectric film includes a chemical vapor deposition process.

The process of planarizing the dielectric film includes a chemical mechanical polishing process.

Figure 4:
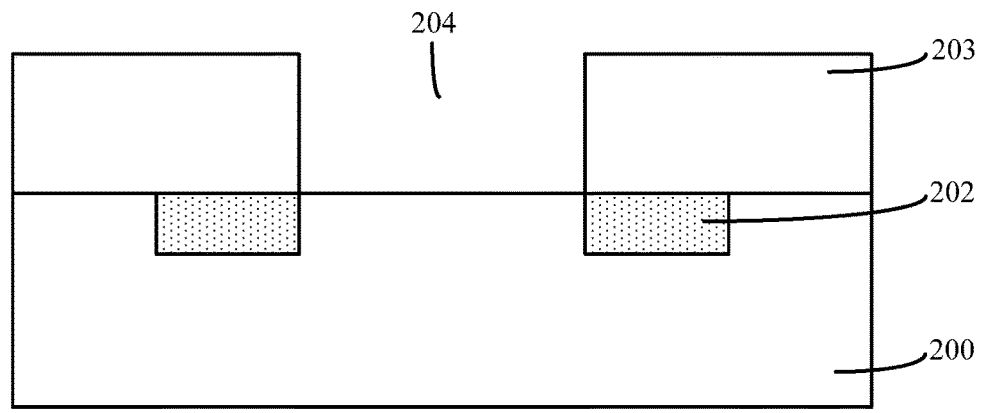

As shown in FIG. 4, the dummy gate structure 201 is removed to form a dummy gate opening 204.

The dummy gate opening 204 is used for subsequently accommodating a gate dielectric layer, a dielectric barrier layer structure, a work function layer, a gate barrier layer structure, and a gate electrode layer.

In one embodiment, the size of the dummy gate opening 204 is elongated along the extending direction of the substrate 200.

In one embodiment, the process of removing the dummy gate structure 201 includes a dry etching process or a wet etching process.

Figure 5:
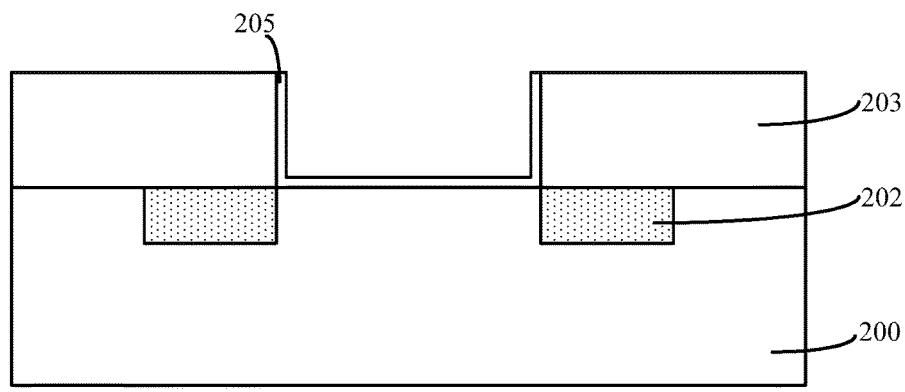

As shown in FIG. 5, a gate dielectric layer 205 is formed on the sidewalls and the bottom of the dummy gate opening 204.

The gate dielectric layer 205 is used for electrically insulating the substrate 200 and the subsequently formed gate electrode layer.

In one embodiment, the gate dielectric layer 205 is made of a high K dielectric material, which refers to a dielectric material with a dielectric constant greater than 3.9, for example, $HfO_2$, $La_2O_3$, HfSiON, $HfAlO_2$, $ZrO_2$, $Al_2O_3$, or $HfSiO_4$. In other embodiments, the gate dielectric layer is a stacked structure including silicon oxide and a high-K dielectric layer.

In one embodiment, the process of forming the gate dielectric layer 205 includes an atomic layer deposition process.

Returning to FIG. 10, after forming the gate dielectric layer, the fabrication method further includes forming a dielectric barrier layer structure on the gate dielectric layer (S103).

Figure 6:
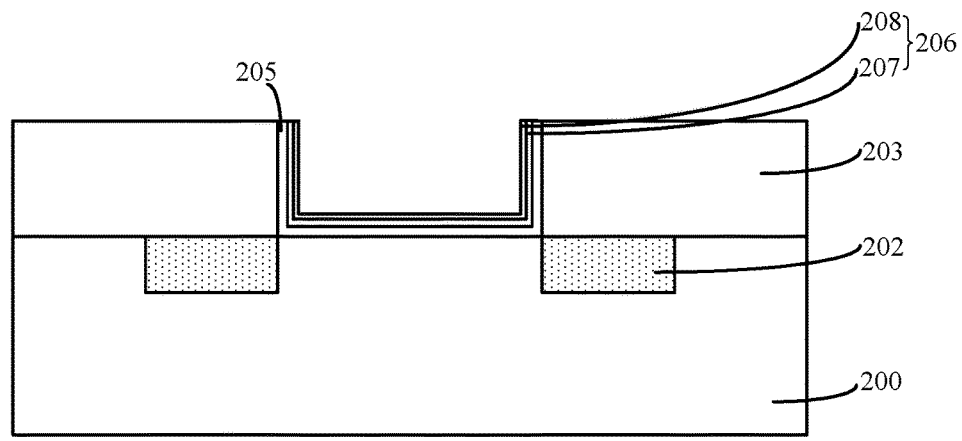

As shown in FIG. 6, a dielectric barrier layer structure 206 is formed on the gate dielectric layer 205. During the formation of the dielectric barrier layer structure 206, silicon is doped in the dielectric barrier layer structure 206 using a first silicon source gas, and the first silicon source gas includes trisilylamine.

The dielectric barrier layer structure 206 is used for blocking the diffusion of the ions in the gate dielectric layer 205 into the subsequently formed work function layer.

The thickness of the dielectric barrier layer structure 206 is in a range of approximately from 30 Å to 60 Å. If the thickness of the dielectric barrier layer structure 206 is less than 30 Å, the barrier performance of the dielectric barrier layer structure 206 against the ions in the gate dielectric layer 205 is very weak, so that the ions in the gate dielectric layer 205 can be easily diffused into the work function layer subsequently formed on the dielectric barrier layer structure 206. The work function value of the work function layer becomes unstable, resulting in poor performance of the work function layer, which is not conducive to improving the performance of the semiconductor structure. When the size of the dummy gate opening 204 along the extending direction of the substrate 200 is constant, if the thickness of the dielectric barrier layer structure 206 is greater than 60 Å, the space for subsequently forming the work function layer, the gate barrier layer structure, and the gate electrode layer on the dielectric barrier layer structure 206 will be relatively small. Thus, the work function layer, the gate barrier layer structure, and the gate electrode layer will be difficult to form, and the formed work function layer, the gate barrier layer structure, and the gate electrode layer will have poor performance, which is not conducive to improving the performance of the semiconductor structure.

In one embodiment, the dielectric barrier layer structure 206 is a stacked structure. The dielectric barrier layer structure 206 includes a first dielectric barrier layer 207 on the gate dielectric layer 205 and a second dielectric barrier layer 208 on the first dielectric barrier layer 207.

The thickness of the first dielectric barrier layer 207 is in a range of approximately from 20 Å to 40 Å. If the thickness of the first dielectric barrier layer 207 is less than 20 Å, the barrier performance of the first dielectric barrier layer 207 against the ions in the gate dielectric layer 205 is not sufficient, and the ions in the gate dielectric layer 205 can easily enter the work function layer subsequently formed on the dielectric barrier layer structure 206. The work function value of the work function layer becomes unstable, deteriorating the performance of the work function layer and the performance of the semiconductor structure. If the thickness of the first dielectric barrier layer 207 is greater than 40 Å, since the first dielectric barrier layer 207 is doped with silicon and silicon is an insulator, the first dielectric barrier layer 207 has a large electrical resistance, which is not conducive to improving the performance of the semiconductor structure.

The first dielectric barrier layer 207 is made of silicon doped titanium nitride. The lattice structure of the silicon-doped titanium nitride material tends to be in an amorphous state, so that the first dielectric barrier layer 207 has a strong barrier effect on the diffusion of the ions in the gate dielectric layer 205 into the subsequently formed work function layer. The ions in the gate dielectric layer 205 cannot be easily diffused into the work function layer, so that the work function value of the work function layer is stable, thereby improving the performance of the work function layer and the performance of the semiconductor structure.

The first dielectric barrier layer 207 is formed by an atomic layer deposition process. The reaction gas of the atomic layer deposition process includes the first silicon source gas and the titanium source gas. The flow rate of the first silicon source gas is in a range of approximately from 50 standard milliliters/minute to 150 standard milliliters/minute. The titanium source gas is $TiCl_4$, and the flow rate of the titanium source gas is in a range of approximately from 100 standard milliliters/minute to 300 standard milliliters/minute. The deposition temperature is in a range of approximately from 200° C. to 350° C., and the pressure in the reaction chamber is in a range of approximately from 2 torr to 10 torr.

In one embodiment, only trisilylamine is selected as the first silicon source gas. In other embodiments, the first silicon source gas may also include trisilylamine and silane.

The significance of selecting trisilylamine as the first silicon source gas for forming the first dielectric barrier layer 207 lies in that the trisilylamine molecule is structurally stable and the silicon ion in the trisilylamine molecule carries a large bond energy. The silicon ions in the first dielectric barrier layer 207 are strongly bonded to the first dielectric barrier layer 207, and thus the silicon ions in the first dielectric barrier layer 207 cannot be easily diffused into the subsequently formed gate electrode layer. Therefore, the gate electrode layer has a good performance and the performance of semiconductor structures is enhanced. The dielectric barrier layer structure 206 includes the first dielectric barrier layer 207, and the first dielectric barrier layer 207 prevents the silicon ions in the dielectric barrier layer structure 206 from diffusing into the subsequently formed gate electrode layer, thereby enhancing the performance of the gate electrode layer and further improving the performance of the semiconductor structure.

In one embodiment, only trisilylamine is selected as the first silicon source gas for forming the first dielectric barrier layer 207. This is because all the silicon ions in the first dielectric barrier layer 207 come from trisilylamine, and the silicon ion in a trisilylamine molecule carries a large bond energy. The binding ability of the silicon ions in the first dielectric barrier layer 207 to the first dielectric barrier layer 207 is very strong, so that the silicon ions in the first dielectric barrier layer 207 cannot be easily diffused into the subsequently formed gate electrode layer, improving the performance of the gate electrode layer and the performance of the semiconductor structure.

The atomic percentage concentration of silicon in the first dielectric barrier layer 207 is in a range of approximately 5%-15%. If the atomic percentage concentration of silicon in the first dielectric barrier layer 207 is less than 5%, the first dielectric barrier layer 207 has a weak barrier performance against the ions in the gate dielectric layer 205, and the ions in the gate dielectric layer 205 can easily enter the subsequently formed work function layer, making the work function value of the work function layer unstable and deteriorating the performance of the work function layer; if the atomic percentage concentration of silicon in the first dielectric barrier layer 207 is greater than 15%, the electrical resistance of the first dielectric barrier layer 207 is relatively large, which is unfavorable for improving the performance of the semiconductor structure.

The second dielectric barrier layer 208 is made of titanium nitride.

The thickness of the second dielectric barrier layer 208 is in a range of approximately from 10 Å to 20 Å. If the thickness of the second dielectric barrier layer 208 is less than 10 Å, the second dielectric barrier layer 208 has a weak barrier performance against the ions in the gate dielectric layer 205, and the ions in the gate dielectric layer 205 can easily enter the work function layer subsequently formed on the dielectric barrier layer structure 206, making the work function value of the work function layer unstable and deteriorating the performance of the work function layer. When the size of the dummy gate opening 204 along the extending direction of the substrate 200 is constant, if the thickness of the second dielectric barrier layer 208 is greater than 20 Å, the space used for subsequently forming the work function layer, the gate barrier layer structure, and the gate electrode layer is very small, which makes the subsequent formation of the work function layer, the gate barrier layer structure, and the gate electrode layer very difficult. The formed work function layer, the gate barrier layer structure, and the gate electrode layer will have poor performance, which is not conducive to improving the performance of the semiconductor structure.

The dielectric barrier layer structure 206 includes a first dielectric barrier layer 207 that is close to the gate dielectric layer 205, and the first dielectric barrier layer 207 is doped with silicon. The barrier performance of the first dielectric barrier layer 207 against ions in the gate dielectric layer 205 becomes better, and the ions in the gate dielectric layer 205 cannot be easily diffused into the subsequently formed work function layer. The work function value of the work function layer is very stable, and the performance of the work function layer is improved. The dielectric barrier layer structure 206 further includes a second dielectric barrier layer 208 on the first dielectric barrier layer 207. The atomic percentage concentration of silicon in the first dielectric barrier layer 207 is in a range of approximately from 5% to 15%, and the second dielectric barrier layer 208 does not contain silicon. Thus, the average atomic percentage concentration of silicon in the dielectric barrier layer structure 206 is less than the atomic percentage concentration of silicon in the first dielectric barrier layer 207, preventing the resistance in the dielectric barrier layer structure 206 from being excessively increased, and thus improving the performance of the semiconductor structure.

Returning to FIG. 10, after forming the dielectric barrier layer structure, the fabrication method further includes forming a work function layer on the dielectric barrier layer structure (S104).

Figure 7:
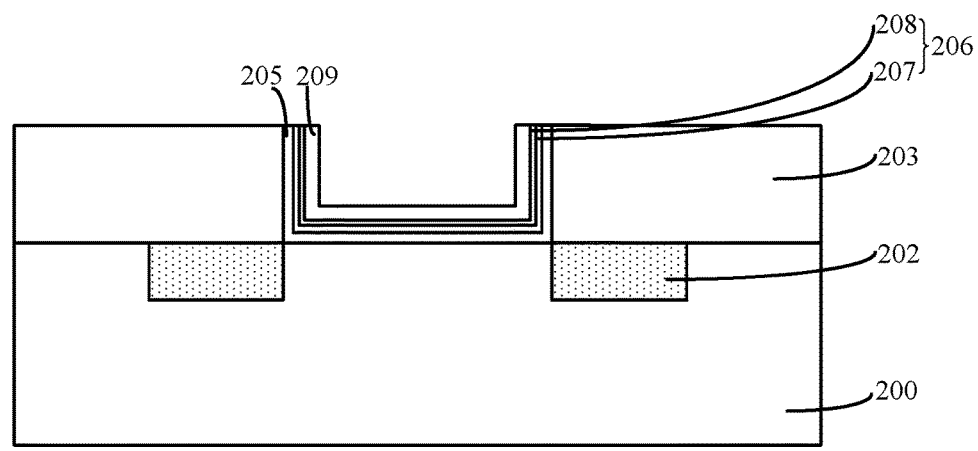

As shown in FIG. 7, a work function layer 209 is formed on the second dielectric barrier layer 208.

The work function layer 209 is used to adjust the threshold voltage.

In one embodiment, the work function layer 209 is used for forming an NMOS transistor, and the work function layer 209 is made of titanium aluminum.

In other embodiments, the work function layer may also be used for forming a PMOS transistor, and the work function layer is made of titanium nitride.

In one embodiment, the work function layer 209 is formed by an atomic layer deposition process. In other embodiments, the work function layer may also be formed by a physical vapor deposition process.

The dielectric barrier layer structure 206 is formed between the gate dielectric layer 205 and the work function layer 209, and the dielectric barrier layer structure 206 can block the ions in the gate dielectric layer 205 from entering the work function layer 209, so that the work function value of the work function layer 209 is stable, improving the performance of the work function layer 209.

Returning to FIG. 10, after forming the work function layer, the fabrication method further includes forming a gate barrier layer structure on the work function layer (S105).

As shown in FIG. 8, a gate barrier layer structure 210 is formed on the work function layer 209. During the formation of the gate barrier layer structure 210, a second silicon source gas is used to dope silicon in the gate barrier layer structure 210, and the second silicon source gas includes trisilylamine.

The gate barrier layer structure 210 is used for blocking the ions in the gate electrode layer formed on the gate barrier layer structure 210 from diffusing into the work function layer 209.

The thickness of the gate barrier layer structure 210 is in a range of approximately from 30 Å to 60 Å. If the thickness of the gate barrier layer structure 210 is less than 30 Å, the barrier performance of the gate barrier layer structure 210 against the ions in the gate electrode layer formed subsequently on the gate barrier layer structure 210 is relatively weak, and the ions in the gate electrode layer can easily enter the work function layer 209. The work function value of the work function layer 209 will become unstable, resulting in poor performance of the work function layer 209, which is not conducive to improving the performance of the semiconductor structure. When the size of the dummy gate opening 204 along the extending direction of the substrate 200 is constant, if the thickness of the gate barrier layer structure 210 is greater than 60 Å, the space for subsequently forming the gate electrode layer is very small, which makes the subsequent formation of the gate electrode layer very difficult. The formed gate electrode layer will have poor performance, which is not conducive to improving the performance of semiconductor structures.

In one embodiment, the gate barrier layer structure 210 is a stacked structure. The gate barrier layer structure 210 includes a first gate barrier layer 211 located on the work function layer 209 and a second gate barrier layer 211 located on the first gate barrier layer 211.

The thickness of the second gate barrier layer 212 is in a range of approximately from 20 Å to 40 Å. If the thickness of the second gate barrier layer 212 is less than 20 Å, the barrier performance of the second gate barrier layer 212 against the ions in the gate electrode layer formed on the gate barrier layer structure 210 is insufficient, and the ions in the gate electrode layer can easily enter the work function layer 209. The work function value of the work function layer 209 will become unstable, deteriorating the performance of the work function layer 209, which is not conducive to improving the performance of the semiconductor structure. If the thickness of the second gate barrier layer 212 is greater than 40 Å, since the second gate barrier layer 212 is doped with silicon and silicon is an insulator, the electrical resistance of the second gate barrier layer 212 is relatively large, which is not conducive to improving the performance of the semiconductor structure.

The second gate barrier layer 212 may be made of silicon doped titanium nitride. The lattice structure of the silicon-doped titanium nitride material tends to be in an amorphous state, such that the second gate barrier layer 212 has a strong barrier performance against the ions in the gate electrode layer material formed on the gate barrier layer structure 210 from entering the work function layer 209. The ions in the gate electrode layer cannot be easily diffused into the work function layer, and thus the work function value of the work function layer is very stable. The performance of the work function layer and the performance of the semiconductor structure are improved.

The second gate barrier layer 212 is formed by an atomic layer deposition process. The atomic layer deposition process includes a reaction gas of the second silicon source gas and the titanium source gas. The flow rate of the second silicon source gas is in a range of approximately from 50 standard milliliters/minute to 150 standard milliliters/minute. The titanium source gas is $TiCl_4$, and the flow rate of the titanium source gas is in a range of approximately from 100 standard milliliters/minute to 300 standard milliliters/minute. The deposition temperature is in a range of approximately from 200° C. to 350° C., and the pressure in the reaction chamber is in a range of approximately from 2 torr to 10 torr.

In one embodiment, only trisilylamine is selected as the second silicon source gas. In other embodiments, the second silicon source gas may also include trisilylamine and silane.

The significance of selecting trisilylamine as the second silicon source gas for forming the second gate barrier layer 212 lies in that the trisilylamine molecule is structurally stable and the silicon ion in a trisilylamine molecule carries a large bond energy, so that the silicon ions in the second gate barrier layer 212 have strong ability to bind with the second gate barrier layer 212. As such, the silicon ions in the second gate barrier layer 212 are less likely to diffuse into the subsequently formed gate electrode layer, improving the performance of the gate electrode layer and further improving the performance of the semiconductor structure. The gate barrier layer structure 210 includes a second gate barrier layer 212, and the second gate barrier layer 212 can prevent the silicon ions in the gate barrier layer structure 210 from diffusing into the subsequently formed gate electrode layer, thereby improving the performance of the gate electrode layer and further improving the performance of the semiconductor structure.

In one embodiment, only trisilylamine is selected as the second silicon source gas for forming the second gate barrier layer 212. This is because all the silicon ions in the second gate barrier layer 212 come from trisilylamine. The silicon ion in a trisilylamine molecule carries a large bond energy and the binding ability of the silicon ions in the second gate barrier layer 212 to the second gate barrier layer 212 is very strong. Thus, the silicon ions in the second gate barrier layers 212 cannot be easily diffused into the subsequently formed gate electrode layer, which improves the performance of the gate electrode layer and further improves the performance of the semiconductor structure.

The atomic percentage concentration of silicon in the second gate barrier layer 212 is in a range of approximately 5%-15%. If the atomic percentage concentration of silicon in the second gate barrier layer 212 is less than 5%, the second gate barrier layer 212 has a weak barrier performance against the ions in the gate electrode layer subsequently formed on the second gate barrier layer 212, and the ions in the gate electrode layer can easily enter the subsequently formed work function layer, making the work function value of the work function layer unstable and deteriorating the performance of the work function layer. If the atomic percentage concentration of silicon in the second gate barrier layer 212 is greater than 15%, the electrical resistance of the second gate barrier layer 212 is relatively large, which is not conducive to improving the performance of semiconductor structures.

In one embodiment, the first gate barrier layer 211 is made of titanium nitride.

The thickness of the first gate barrier layer 211 is in a range of approximately 10~20 Å. If the thickness of the first gate barrier layer 211 is less than 10 Å, the barrier performance of the first gate barrier layer 211 against the ions in the subsequently formed gate electrode layer material is not sufficient, and the ions in the gate electrode layer material can easily enter the work function layer 209, making the work function value of the work function layer 209 unstable and deteriorating the performance of the work function layer 209. When the size of the dummy gate opening 204 along the extending direction of the substrate 200 is constant, if the thickness of the first gate barrier layer 211 is greater than 20 Å, the space for the subsequently forming the gate electrode layer is very small, which makes the subsequent formation of the gate electrode layer very difficult. This results in poor performance of the gate electrode layer, which is not conducive to improving the performance of the semiconductor structure.

The gate barrier layer structure 210 includes a second gate barrier layer 212. The second gate barrier layer is close to the gate electrode layer subsequently formed on the gate barrier layer structure 210 and the second gate barrier layer 212 is doped with silicon. Therefore, the barrier performance of the second gate barrier layer 212 against the ions in the gate electrode layer is very strong, and the ions in the gate electrode layer cannot easily diffuse into the subsequently formed work function layer. The work function value of the work function layer is stabilized, thereby improving the performance of the work function layer. In addition, the gate barrier layer structure 210 further includes a first gate barrier layer 211 located between the second gate barrier layer 212 and the work function layer 209. The atomic percentage concentration of silicon in the second gate barrier layer 212 is in a range of approximately 5%-15%, and the first gate barrier layer 211 does not contain silicon. Thus, the average atomic percentage concentration of silicon in the gate barrier layer structure 210 is less than the atomic percentage concentration of silicon in the second gate barrier layer 212, avoiding excessive increase of the resistance of the gate barrier layer structure 210 and improving the performance of the semiconductor structure.

Returning to FIG. 10, the fabrication method further includes forming a gate electrode layer on the gate barrier layer structure (S106).

As shown in FIG. 9, a gate electrode layer 213 is formed on the gate barrier layer structure 210.

The formation process of the gate electrode layer 213 includes: forming a gate electrode film on the gate barrier layer structure 210 and on the dielectric layer 203; planarizing the gate electrode film until the top surface of the dielectric layer 203 is exposed to form a gate electrode layer 213.

In one embodiment, the planarizing process includes a chemical mechanical polishing process.

In one embodiment, the gate electrode layer 213 is made of Al. In other embodiments, the gate electrode layer may also be made of one or more of Cu, Ag, Au, Ni, Ti, W, WN, or WSi.

The gate barrier layer structure 210 is used for isolating the gate electrode layer 213 from the work function layer 209. The gate barrier layer structure 210 can prevent the ions in the gate electrode layer 213 from diffusing into the work function layer 209, so that the work function value of the work function layer 209 is stable, improving the performance of the work function layer 209 and in turn the performance of the semiconductor structure.

As such, in the present disclosure the dielectric barrier layer structure is doped with silicon, and the lattice structure of the dielectric barrier layer structure tends to be in an amorphous state. The dielectric barrier layer structure has a strong ability to block the ions in the gate dielectric layer, and the ions in the gate dielectric layer cannot easily enter the work function layer. The work function value of the work function layer can be relatively stable, which improves the performance of the work function layer. Accordingly, the gate barrier layer structure is doped with silicon, and the lattice structure of the gate barrier layer structure tends to be in an amorphous state. The gate barrier layer structure has a strong ability to block the ions in the gate electrode layer, and the ions in the gate electrode layer cannot easily enter the work function layer. The work function value of the work function layer can be relatively stable, which improves the performance of the work function layer. The dielectric barrier layer structure is doped with silicon using a first silicon source gas including trisilylamine. The trisilylamine molecule is structurally stable, and the silicon ion in a trisilylamine molecule carries a large bond energy, so that the binding ability of the silicon ions in the dielectric barrier structure to the dielectric barrier layer structure is very strong. The silicon ions in the dielectric barrier layer structure cannot easily diffuse into the gate electrode layer, thereby improving the performance of the gate electrode layer. Correspondingly, silicon is doped in the gate barrier layer structure by using a second silicon source gas including trisilylamine. The trisilylamine molecule is structurally stable, and the silicon ion in a trisilylamine molecule carries a large bond energy, so that the silicon ions in the gate barrier layer structure have strong binding ability with the gate barrier layer structure. Therefore, the silicon ions in the gate barrier layer structure cannot easily diffuse into the gate electrode layer, thereby improving the performance of the gate electrode layer.

In one exemplary embodiment, a stacked film including a TiSiN layer doped with silicon by a trisilylamine precursor and a TiN layer is formed as the capping layer of the high-K film and as the barrier layer of the electrode, respectively. The thickness of the TiSiN layer is around ⅔ the total thickness of the stacked film while the thickness of the TiN layer is around ⅓ the total thickness of the stacked film.

Compared with conventional methods, the fabrication method disclosed in the present disclosure is advantageous.

In the method of forming a semiconductor structure provided by the present disclosure, the dielectric barrier layer structure is doped with silicon, and the lattice structure of the dielectric barrier layer structure tends to be in an amorphous state. The dielectric barrier layer structure has a strong barrier performance against the ions in the gate dielectric layer, and the ions in the gate dielectric layer material cannot easily enter the work function layer. As such, the work function value of the work function layer is stable, which improves the performance of the work function layer. Accordingly, the gate barrier layer structure is doped with silicon, and the lattice structure of the gate barrier layer structure tends to be in an amorphous state. The gate barrier layer structure has a strong barrier performance against the ions in the gate electrode layer, and the ions in the gate electrode layer cannot easily enter the work function layer. As such, the work function value of the work function layer is relatively stable, thereby improving the performance of the work function layer. Also, a first silicon source gas is used to dope silicon in the dielectric barrier layer structure, and the first silicon source gas includes trisilylamine. The trisilylamine molecule is structurally stable, and the silicon ion in a trisilylamine molecule carries a large bond energy. Thus, the binding ability of the silicon ions in the dielectric barrier layer structure to the dielectric barrier layer structure is strong, and the ions in the dielectric barrier layer structure cannot easily diffuse into the gate electrode layer, thereby improving the performance of the gate electrode layer. Correspondingly, a second silicon source gas including trisilylamine is used to dope silicon in the gate barrier layer structure. The trisilylamine molecule is structurally stable, and the silicon ion in a trisilylamine molecule carries large bond energy. Thus, the binding ability of the silicon ions in the gate barrier layer structure to the gate barrier layer structure is very strong, and the silicon ions in the gate barrier layer structure cannot easily diffuse into the gate electrode layer, thereby improving the performance of the gate electrode layer.

Further, the dielectric barrier layer structure includes a first dielectric barrier layer on the gate dielectric layer that is close to the gate dielectric layer, and the first dielectric barrier layer is doped with silicon. The first dielectric barrier layer has a strong barrier performance against the ions in the gate dielectric layer, and the ions in the gate dielectric layer cannot be easily diffused into the work function layer. The work function value of the work function layer is stable, thereby improving the performance of the work function layer. The dielectric barrier layer structure further includes a second dielectric barrier layer on the first dielectric barrier layer. The atomic percentage concentration of silicon in the first dielectric barrier layer is in a range of approximately from 5% to 15%, and the second dielectric barrier layer does not contain silicon, so that the average atomic percentage concentration of silicon in the dielectric barrier layer structure is less than the atomic percentage concentration of silicon in the first dielectric barrier layer. This avoids excessive increase in electrical resistance in the dielectric barrier layer structure, thereby improving the performance of the semiconductor structure.

Further, the gate barrier layer structure includes a second gate barrier layer that is to the gate electrode layer, and the second gate barrier layer is doped with silicon. The barrier performance of the second gate barrier against the ions in the gate electrode layer is very strong. The gate barrier layer structure further includes a first gate barrier layer between the second gate barrier layer and the work function layer. The first gate barrier is not doped with silicon, and the atomic percentage concentration of silicon in the second gate barrier layer is in a range of approximately from 5% to 15%, so that the average atomic percentage concentration of silicon in the gate barrier layer structure is less than the atomic percentage concentration of silicon in the second gate barrier layer. This avoids excessive increase in electrical resistance in the gate barrier layer, improving the performance of the semiconductor structure.

The above detailed descriptions only illustrate certain embodiments of the disclosed disclosure, and are not intended to limit the scope of the disclosed disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method of forming a semiconductor structure, comprising:
    providing a substrate;
    forming a gate dielectric layer on the substrate;
    forming a dielectric barrier layer structure on the gate dielectric layer, wherein a first silicon source gas is used to dope silicon in the dielectric barrier layer structure;
    forming a work function layer on the dielectric barrier layer structure;
    forming a gate barrier layer structure on the work function layer, wherein a second silicon source gas is used to dope silicon in the gate barrier layer structure, wherein the dielectric barrier layer structure has a stacked structure and an average atomic percentage concentration of silicon in the dielectric barrier layer structure is smaller than an average atomic percentage concentration of silicon in a layer of the stacked structure adjacent to the work function layer; and
    forming a gate electrode layer on the gate barrier layer structure.

2. The method according to claim 1, wherein the dielectric barrier layer structure includes:
    a first dielectric barrier layer doped with silicon on the gate dielectric layer, and
    a second dielectric barrier layer on the first dielectric barrier layer.

3. The method according to claim 2, wherein:
    a thickness of the first dielectric barrier layer is in a range of approximately from 20 Å to 40 Å.

4. The method according to claim 2, wherein:
    the first dielectric barrier layer is made of a material including silicon-doped titanium nitride.

5. The method according to claim 2, wherein:
    an atomic percentage concentration of silicon in the first dielectric barrier layer is in a range of approximately 5%-15%.

6. The method according to claim 4, wherein:
    the first dielectric barrier layer structure is formed by an atomic layer deposition process and the first silicon source gas includes trisilylamine;
    the atomic layer deposition process includes a reaction gas of the first silicon source gas and a titanium source gas, wherein the first silicon source gas has a flow rate in a range of approximately from 50 standard milliliters/minute to 150 standard milliliters/minute, and the titanium source gas includes $TiCl_4$ with a flow rate in a range of approximately from 100 standard milliliters/minute to 300 standard milliliters/minute;
    the atomic layer deposition process further includes a deposition temperature in a range of approximately from 200° C. to 350° C. and a pressure of the reaction chamber in a range of approximately from 2 Torr to 10 Torr.

7. The method according to claim 2, wherein:
    a thickness of the second dielectric barrier layer is in a range of approximately from 10 Å to 20 Å.

8. The method according to claim 2, wherein:
    the second dielectric barrier layer is made of a material including titanium nitride; and
    the second dielectric barrier layer is formed by an atomic layer deposition process.

9. The method according to claim 1, wherein the gate barrier layer structure includes:
    a first gate barrier layer on the work function layer, and
    a second gate barrier layer on the first gate barrier layer, wherein the second gate barrier layer is doped with silicon.

10. The method according to claim 9, wherein:
    a thickness of the first gate barrier layer is in a range of approximately from 10 Å to 20 Å.

11. The method according to claim 9, wherein:
    the first gate barrier layer is made of a material including titanium nitride; and
    the first gate barrier layer is formed by an atomic layer deposition process.

12. The method according to claim 9, wherein:
    a thickness of the second gate barrier layer is in a range of approximately from 20 Å to 40 Å.

13. The method according to claim 9, wherein:
    the second gate barrier layer is made of a material including silicon-doped titanium nitride.

14. The method according to claim 9, wherein:
    an atomic percentage concentration of silicon in the second gate barrier layer is in a range of approximately 5%-15%.

15. The method according to claim 13, wherein:
    the second gate barrier layer is formed by an atomic layer deposition process, and the second silicon source gas includes trisilylamine;
    the atomic layer deposition process includes a reaction gas of the second silicon gas and a titanium source gas, wherein the flow rate of the second silicon source gas is in a range of approximately from 50 standard milliliters/minute to 150 standard milliliters/minute, and the titanium source gas includes $TiCl_4$ with a flow rate in a range of approximately from 100 standard milliliters/minute to 300 standard milliliters/minute; and
    the atomic layer deposition process further includes a deposition temperature in a range of approximately from 200° C. to 350° C. and a pressure of the reaction chamber in a range of approximately from 2 Torr to 10 Torr.

16. The method according to claim 1, wherein:

each of the first and second silicon source gases includes trisilylamine or a combination of trisilylamine and silane.

17. The method according to claim 2, wherein:

the average atomic percentage concentration of silicon in the dielectric barrier layer structure is smaller than the average atomic percentage concentration of silicon in the first dielectric barrier layer.

18. The method according to claim 9, wherein:

the gate barrier layer structure have stacked structures, and an average atomic percentage concentration of silicon in the gate barrier layer structure is smaller than an average atomic percentage concentration of silicon in the second gate barrier layer.

* * * * *